(12) United States Patent
Kishimoto et al.

(10) Patent No.: US 6,368,730 B1
(45) Date of Patent: Apr. 9, 2002

(54) ELECTROLUMINESCENT DEVICE

(75) Inventors: Yoshio Kishimoto, Hirakata; Ritsuo Inaba, Neyagawa, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/168,560

(22) Filed: Oct. 9, 1998

(30) Foreign Application Priority Data

| | | |
|---|---|---|
| Oct. 13, 1997 | (JP) | P 9-278355 |
| Nov. 27, 1997 | (JP) | P 9-325738 |
| Jan. 21, 1998 | (JP) | P 10-009389 |

(51) Int. Cl.[7] .............................................. H05B 33/00
(52) U.S. Cl. ...................... 428/690; 428/917; 313/502; 313/504; 313/506
(58) Field of Search .............................. 428/690, 917; 313/502, 504, 506

(56) References Cited

U.S. PATENT DOCUMENTS

| | | | | |
|---|---|---|---|---|
| 2,941,104 A | * | 6/1960 | Swindells | 313/108 |
| 4,885,211 A | * | 12/1989 | Tang et al. | 428/457 |
| 5,891,554 A | * | 4/1999 | Hosokawa et al. | 428/212 |
| 6,124,024 A | * | 9/2000 | Hosokawa et al. | 428/212 |
| 6,143,434 A | * | 11/2000 | Okada | 428/690 |

FOREIGN PATENT DOCUMENTS

JP 7-114350 5/1995

OTHER PUBLICATIONS

Tang et al., "Organic electroluminescent diodes", Appl. Phys. Lett., vol. 51, No. 12, Sep. 21, 1987 pp. 913–914.

* cited by examiner

*Primary Examiner*—Cynthia H. Kelly
*Assistant Examiner*—Dawn Garrett
(74) *Attorney, Agent, or Firm*—Wenderoth, Lind & Ponack, L.L.P.

(57) ABSTRACT

An electroluminescent device includes a transparent substrate, a transparent anode, a thin film electrode and a light emitting organic polymer layer. Both of the surface of the transparent substrate and the surface of the transparent anode are imparted hydrophobicity so that an excellent electroluminescent device which hardly causes change in luminance with a lapse of time and has few dark spots can be obtained. Also a new polymer film is used as the transparent substrate so that a thin and flexible electroluminescent device, which hardly causes change in luminance with a lapse of time and has few dark spots, can be obtained. Also a new construction color electroluminescent display panel is described, which can be made flexible and reduced in thickness, long life, superior in resolution and easily produced.

21 Claims, 4 Drawing Sheets light emission

ELECTROLUMINESCENT DEVICE

BACKGROUND OF THE INVENTION

The present invention relates to an electroluminescent device made of an organic light emitting material, which is used in a light emitting display, a light emitting diode and a surface light emitting source.

An electroluminescent device (EL) is a device utilizing a phenomenon of light emission when electric field is applied to a certain light emitting material. A display made of the electroluminescent device can realize a thin type display with wide angle of visual field and low dissipation power because it is capable of spontaneously emitting light and no back light is required. The display also has a feature that it can perform high-speed response. However, since the light emitting efficiency of a conventional light emitting material is low, luminance of the display was insufficient. There was also a problem that it was difficult to realize a color display because light emitting color of the light emitting material was limited.

Recently, an excellent electroluminescent device using an organic compounds as a constituent material has been reported (e.g. related paper, Applied Physics Letters, vol.51, 1987, p.913). In this report, C. W. Tang et al. disclose an injection type electroluminescent device having a structure that an organic light emitting layer and an electric charge transporting layer are laminated. In case of this electroluminescent device, an excellent electroluminescent device having high luminance is obtained by using a tris(8-quinolinol)aluminum complex (hereinafter abbreviated to Alq) having both high light emitting efficiency and high electron transporting ability as the light emitting material.

In Journal of Applied Physics, vol.65, 1989, p. 3610, it is reported that an organic light emitting layer is formed with Alq which doped with a fluorescent dye such as coumarin derivative, DCM1 (Eastman Chemicals) or the like, and a light emitting device using that organic layer is made and a luminescent color of the device changes by proper selection of the dye. It is also disclosed that the light emitting efficiency is enhanced compared with a non-doped device.

Various researches and developments have been made subsequent to this study. As a result, a fluorescent metal chelete complex, an electron transporting organic molecule and a hole transporting organic molecule have been developed as a new light emitting material and a development of a light emitting material for color display having high luminance has rapidly been advanced.

Various electrode materials suited for these light emitting materials have also been studied. For example, Japanese Patent laid-Open Publications Nos. 60-165771 and 5-121172 disclose a metal thin film electrode made of metals having a small work function such as Mg—Ag, Ca, Ag, Li—Al, Li—Ag, Al and the like as an electron injection electrode, which is formed by deposition.

However, the above electroluminescent device has a problem that life is short. Since the light emitting material and electrode material are easily affected by water, these materials are considerably deteriorated by moisture absorption of the device. Electroluminescence essentially occurs by electronic conduction in the light emitting material, but in the presence of water, conduction of ions simultaneously occurs. When the light emitting efficiency is lowered by such phenomena, a driving voltage of the electroluminescent device is increased and luminance is lowered. As a result, a dark spot is formed at the portion where luminance is considerably lowered.

Various display panel structures for color display have also been studied, together with the development of the material As a structure of a color panel, a structure wherein light emitting layer patterns of three colors are arranged on one substrate is most popular. However, since this structure requires three patterning processes for forming light emitting layer patterns on one substrate, there can be caused problems such as deterioration of each light emitting material due to chemicals and water during the patterning processes, and low yield of the process. To avoid these problems, Japanese Patent Laid-Open Publication No. 7-114350 discloses a color panel structure that three monochromatic panels are superposed. In this publication, each monochromatic panel comprises a transparent made of an acrylic resin or glass substrate. However, a color display panel having this structure is very thick and has a problem that, since adjacent picture element electrodes are separated each other in back and forth, light shadow is formed by each of picture element electrodes and, therefore, resolution and color separation at the time of diagonally observing the picture plane are insufficient and thus high picture quality is not obtained. There is also a problem that the substrate is liable to be broken by distortion on lamination when the substrate is made of glass.

SUMMARY OF THE INVENTION

The present invention has been developed to overcome the above described disadvantages.

A first object of the present invention is to solve the above conventional problems by improving a transparent substrate and a transparent electrode, and to provide an injection type excellent electroluminescent device which hardly causes change in luminance with a lapse of time and has few dark spots.

A second object of the present invention is to provide an injection type electroluminescent device which hardly causes change in luminance with a lapse of time and has few dark spots, and which is thin and flexible, by using a new sheet material as a transparent substrate.

A third object of the present invention is to provide an excellent color electroluminescent display panel which hardly causes change in luminance with a lapse of time and has few dark spots, and is thin in thickness, superior in resolution and color separation and easily produced.

In accomplishing the first object, a first aspect of the present invention is an electroluminescent device comprising a transparent anode formed on a transparent substrate; a thin film cathode containing an alkali metal or an alkali earth metal; an electron transporting organic molecule and a hole transporting organic molecule between a pair of electrodes consisting of said transparent and said thin film cathode; and a barrier sheet for covering the outer surface of said thin film cathode; wherein both of the surface of said transparent substrate and the surface of said transparent anode have a hydrophobic surface with a molecular structure without having active hydrogen. With this construction, the water content of the device is reduced from the beginning and, at the same time, penetration of water is inhibited, thereby making it possible to obtain an excellent electroluminescent device which hardly causes change in luminance with a lapse of time and has few dark spots.

In accomplishing the second object, a second aspect of the present invention is an electroluminescent device comprising a transparent anode formed on a transparent substrate; a thin film cathode containing an alkali metal or an alkali earth metal; an electron transporting organic molecule and a hole transporting organic molecule between a pair of electrodes consisting of said transparent and said thin film cathode; and a barrier sheet for covering the outer surface of said thin film cathode; wherein said transparent substrate comprises:

(a) a two-layer polymer film comprising an adhesive hydrophobic polymer layer containing at least one functional group selected from the group consisting of amino group, amide group, hydroxyl group and carboxyl group in the concentration of not more than 1% by weight and a hydrogen-bonding polymer layer containing at least one functional group selected from the group consisting of amino group, amide group, hydroxyl group and carboxyl group, or (b) a three-layer polymer film comprising said hydrogen-bonding polymer layer, a hydrophobic polymer layer made of at least one kind selected from the group consisting of polyolefin, polyvinylidene chloride, polyvinyl chloride, polyacrylonitrile, fluorine-containing polymer, liquid crystalline polyester and silicone resin and an adhesive polymer layer inserted therebetween containing at least one functional group selected from the group consisting of amino group, amide group, hydroxyl group and carboxyl group.

Regarding the second aspect of the present invention, the transparent substrate is made of an excellent polymer sheet having both barrier property to water and interlaminar bonding property, and the following advantageous effect can be obtained.

(1) Permeation of a gas, especially moisture, from the outside can be remarkably inhibited.

(2) The humidity in the device can be considerably reduced because of no adsorbed moisture on the substrate and no source for evolution of moisture.

(3) The sufficiently dried hydrogen-bonding polymer layer also has an function as a getter of moisture.

(4) The polymer film has a multi-layer construction, in which peeling does not arise because of good interlaminar adhesive property.

(5) Since the transparent substrate is made of a flexible polymer sheet having high transparency, a flexible device having high performance and utility can also be produced.

(6) Although the film has a multi-layer construction, continuous production of the film can be easily performed.

With such a lot of effects, there can be constructed an excellent electroluminescent device which hardly causes change in luminance with a lapse of time and has few dark spots, and which is thin in thickness and flexible.

In accomplishing the third object, a third aspect of the present invention is a multi-color electroluminescent display panel comprising at least two monochromatic panel units, wherein each monochromatic panel unit comprises (A) a transparent substrate comprising:

(a) a two-layer polymer film comprising an adhesive hydrophobic polymer layer containing at least one functional group selected from the group consisting of amino group, amide group, hydroxyl group and carboxyl group in the concentration of not more than 1% by weight and a hydrogen-bonding polymer layer containing at least one functional group selected from the group consisting of amino group, amide group, hydroxyl group and carboxyl group, or (b) a three-layer polymer film comprising said hydrogen-bonding polymer layer, a hydrophobic polymer layer made of at least one kind selected from the group consisting of polyolefin, polyvinylidene chloride, polyvinyl chloride, polyacrylonitrile, fluorine-containing polymer, liquid crystalline polyester and silicone resin and an adhesive polymer layer inserted therebetween containing at least one functional group selected from the group consisting of amino group, amide group, hydroxyl group and carboxyl group;

(B) a striped transparent anode on the transparent substrate;

(C) a fluorescent organic layer having an electron transporting organic molecule and a hole transporting organic molecule; and (D) striped thin film cathodes formed in the direction perpendicular to the striped transparent anode with half or less width of a full width of a picture element of the multi-color electroluminescent device, and wherein the monochromatic panel units are laminated each other so that said striped thin film cathodes are not overlapped each other above and below.

Since the transparent substrate is made of a polymer film having high barrier property to water, it is possible to construct a long life monochromatic panel unit which hardly causes change in luminance with a lapse of time and has few dark spots. Since the monochromatic panel unit is very thin in thickness, the thickness of the whole panel does not become too large and, furthermore, flatness is sufficient. Since the distance in back and forth between adjacent picture elements is comparatively small, light shadow due to adjacent picture elements is hardly formed and, therefore, resolution and color separation of the display panel are superior. The present invention also has such a feature that, since there is no need to repeat the patterning processes to form light emitting layers of multi colors on one substrate, the panel production steps do not require high precision and are not complicated. Accordingly, the yield of the panel production is high.

As described above, the present invention provides an excellent electroluminescent device which has long life and high picture quality and is easily produced, and its industrial value is great.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

Figure 1A:
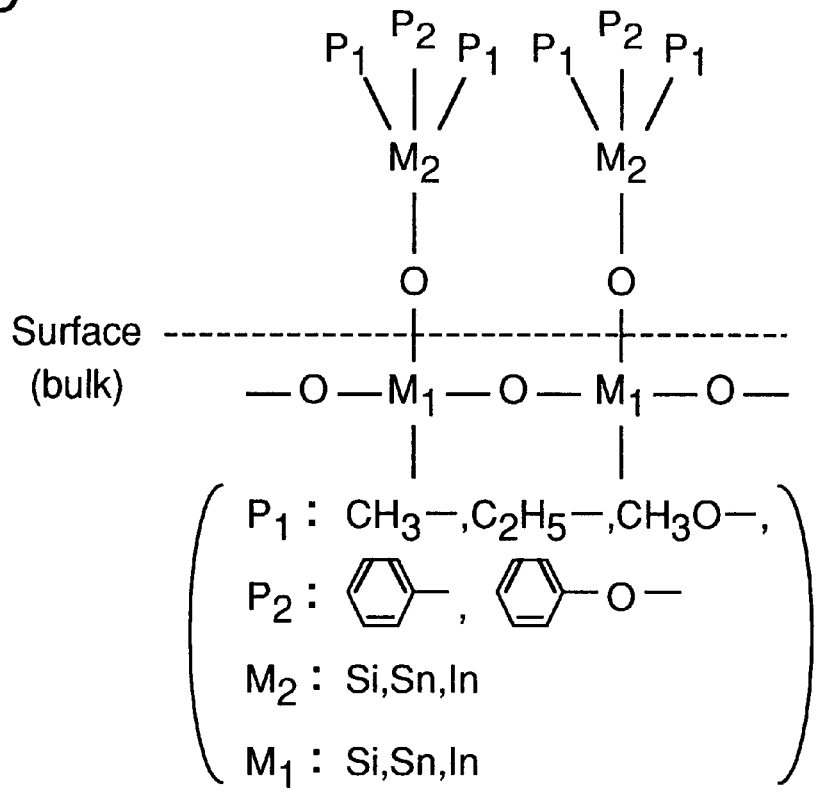
FIG. 1 is a schematic diagram showing one example of a molecular structure at the hydrophobic surface of the transparent anode or the transparent substrate of the electroluminescent device in embodiment 1 according to the present invention.

The present application is based on applications in Japan, Japanese Patent Applications Nos. 09-278355, 09-325738 and 10-009389, and the contents of which are incorporated hereinto by reference.

EMBODIMENT 1

The first embodiment of the present invention is an electroluminescent device comprising a transparent anode formed on a transparent substrate; a thin film cathode containing an alkali metal or an alkali earth metal; an electron transporting organic molecule and a hole transporting organic molecule between a pair of electrodes consisting of said transparent and said thin film cathode; and a barrier sheet for covering the outer surface of said thin film cathode; wherein both of the surface of said transparent substrate and the surface of said transparent anode have a hydrophobic surface with a molecular structure without having active hydrogen.

The transparent substrate is, for example, a glass substrate and the transparent anode is composed of a transparent conductive film containing indium oxide or tin oxide as a main component. The molecular structure of the surface of the transparent substrate and that of the transparent anode is preferably an aromatic molecular structures which has not any of O—H bond and N—H bond. For example, the aromatic structure is a phenoxysilyl group, a phenylsilyl group, phenoxytin group, phenyltin group, phenoxyindium or phenylindium, any of which does not have active hydrogen. These aromatic groups are hydrophobic and chemically stable and show high conjugation of $\pi$-electrons, and also high affinity with an organic light emitting molecule formed on a transparent anode and thus peeling does not occur between the anode and the light emitting organic layer. A phenyl derivative having a substituent in the benzene ring as well as diphenyl and triphenyl derivatives are included in the range of the above molecular structure.

Alternatively, the aromatic molecular structure may be tertiary aromatic amine, aromatic ether, nitrogen coordination metal complex and oxygen coordination metal complex can be used. The tertiary amine and aromatic ether are a structure suited for transporting electrons and holes, and the nitrogen coordination metal complex and oxygen coordination metal complex form a preferable interfacial molecular structure at the metal electrode interface.

Examples of the above oxygen coordination metal complex include a metal complex of an electrode surface metal and quinolinol.

As the nitrogen-containing aromatic compound, for example, quinoline compound, imidazole compound, triazole compound, oxadiazole compound, oxyquiazoline compound and triphenylamine compound can be used. These ligands have a preferred molecular structures which is chemically stable and shows high conjugation property of $\pi$-electrons.

Examples of the above quinoline compound used in the present invention include naphthoquinones and quinoline complex, in addition to quinolinols of Alq described above. As the imidazole compound, for example, benzimidazoles and aromatic derivatives such as phenyl-substituted, diphenyl-substituted and pyridyl-substituted derivatives are preferred. As the triazole compound, for example, benztriazoles and aromatic derivatives such as phenyl-substituted, diphenyl-substituted and pyridyl-substituted derivatives are also preferred, and an analogue having the same function as that of them includes triazine derivative. As the oxadiazole compound, for example, aromatic derivatives such as phenyl-substituted, diphenyl-substituted and pyridyl-substituted derivatives are also preferred. Examples of the oxyquinazoline compound include various derivatives like the above quinolines.

When the transparent anode is made of indium tin oxide (ITO), the hydrophobicity may be imparted to the anode through thermal oxidation at high temperature, for example, above 350° C. with oxidation gas such as humid air bubbled through water. It is a simple and easy method to impart the hydorophpbicity, however, the transparent substrate such as soda-lime glass could not be imparted hydrophobicity through the thermal oxidation process. In that case, the transparent substrate may be imparted hydorophobicity by different ways before forming the transparent anode thereon.

For example, hydrophobicity may be imparted to the surface of the glass substrate by modifying the molecular structure of the glass surface to contain a silicate of a metal element such as zinc, cadmium, tin, lead, indium, strontium, barium or the like. These molecular structures respectively form an excellent hydrophobic surface. Among them, strontium silicate, barium silicate and zinc silicate are preferred. Tin and indium are a preferable element because of high affinity with an anode.

Hydrophobicity may also be imparted by using a glass substrate of aluminosilicate glass as the transparent substrate. Since this glass has high softening point of about 1000° C. but does not contain an element causing moisture absorption (e.g. K, Na, etc.), it is preferred as the transparent substrate having a hydrophobic surface in the present invention.

Hydrophobicity may also be imparted by forming a transparent protective layer having a hydrophobic surface with a molecular structure without having active hydrogen on the surface of the glass substrate as the transparent substrate. As the transparent protective layer, a transparent inorganic material such as zinc oxide or a transparent organic polymer can be used.

In such way, by imparting hydrophobicity to both of the surface of the transparent substrate and the surface of the transparent anode, adsorbed water on the substrate disappears, thereby to lower a light emitting initial voltage (Vth) and to drastically lower the growth of the dark spot (non-light emitting point).

Usually active hydrogen is present on the surface of the transparent substrate such as glass and the surface of the transparent anode such as ITO. After the hydrophobicity was imparted to such surfaces, there is no ion between electrodes. Thus, electrolysis reaction, evolution of gas and chemical change of materials do not occur but only electronic conduction occur, thereby a light emitting device capable of stably operating for a long period of time is obtained.

The alkali metal element or alkali earth metal element (M2) used in the above thin film cathode is preferably any of Ca, Mg and Li. The metal alloy thin film is made of various materials, but is preferably made of at least one of Al-alloy, Al—Zn alloy, Ag alloy, Sn alloy, Bi alloy and In alloy. The concentration of the alkali metal or alkali earth metal in the metal alloy thin film is adjusted to an optimum value in view of the work function which decides electron injection performances, film forming properties of the metal thin film and stability of the metal electrode or its interface. The effect of the present invention is further enhanced by also imparting the hydrophobicity to these surfaces.

As the electron transporting organic molecule and the hole transporting organic molecule, there can be used organometal pigments and amines, which have already been known. Among them, a quinoline metal complex is one of the best specific materials because of high fluorescent properties and high electronic (redox) stability, and examples thereof include various compounds such as Alq and $Be(Qn)_2$ wherein Al is replaced by Be. It is also possible to enhance the effect by simultaneously adding a dopant such as DPT (diphenyltetracene), BTX (benzotiooxaccene), quinacridone, rubrene or the like. It is possible to enhance the effect of the present invention by using those having a hydrophobic molecular structure without having active hydrogen, which does not contain any of O—H bond and N—H bond in the structure, as the molecular structure.

The barrier sheet to be formed outside of the above thin film cathode is mainly used for barrier of water, oxygen and polar gas (e.g. NOx, SOx, $NH_3$, etc.). A resin, a polymer sheet, a metal sheet and glass can be used, but those having high barrier effect are preferred.

The above electroluminescent device of the present invention comprises an electron transporting layer made of an electron transporting organic molecule, a hole transporting layer made of a hole transporting organic molecule. However, a device of three-layer construction may be formed by separately adding the fluorescent molecule layer. It is also possible to form a device with a dopant and a conductive polymer layer, and it is also preferred that these layers also have hydrophobic structures.

EMBODIMENT 2

The second embodiment of the present invention is an electroluminescent device comprising a transparent anode formed on a transparent substrate; a thin film cathode containing an alkali metal or an alkali earth metal; an electron transporting organic molecule and a hole transporting organic molecule between a pair of electrodes consisting of said transparent and said thin film cathode; and a barrier sheet for covering the outer surface of said thin film cathode; wherein said transparent substrate comprises;
(a) a two-layer polymer film comprising an adhesive hydrophobic polymer layer containing at least one functional group selected from the group consisting of amino group, amide group, hydroxyl group and carboxyl group in the concentration of not more than 1% by weight and a hydrogen-bonding polymer layer containing at least one functional group selected from the group consisting of amino group, amide group, hydroxyl group and carboxyl group, or
(b) a three-layer polymer film comprising said hydrogen-bonding polymer layer, a hydrophobic polymer layer made of at least one kind selected from the group consisting of polyolefin, polyvinylidene chloride, polyvinyl chloride, polyacrylonitrile, fluorine-containing polymer, liquid crystalline polyester and silicone resin and an adhesive polymer layer inserted therebetween containing at least one functional group selected from the group consisting of amino group, amide group, hydroxyl group and carboxyl group.

This flexible film of two- or three-layer construction has an function that it shows very high barrier property to various substances containing moisture.

Since the content of water in the panel is extremely reduced by making the display panel with such a laminated flexible film, ions do not move even if ions are present between the electrodes. A electrolysis reaction evolution of gas and chemical change of materials do not occur but only electronic conduction occur, thereby a light emitting device capable of stably operating for a long period of time is obtained.

The adhesive hydrophobic polymer layer of the two-layer polymer film can be obtained by copolymerizing a hydrophobic polymer with a little quantity of monomer having a functional group such as amino group, amide group, hydroxyl group, carboxyl group or the like, or a reactive treatment of a terminal group of the hydrophobic polymer. It can also be obtained easily by blending with a substance having these functional groups. Specific material of the adhesive hydrophobic polymer include adhesive polyolefin obtained by copolymerizing methacrylic acid or maleic acid, adhesive PVDF, adhesive PVDC or the like. Polyethylene referred to "adomer" (Mitsui Polychemical Co Ltd) or ionomer is included in the adhesive hydrophobic polymer.

Although the concentration of the above described functional group, which is hydrophilic, is relatively low, not more than 1% by weight, sufficient adhesive property can be imparted to the hydrophobic polymer, keeping high hydrophobic performance (moisture barrier function) of the hydrophobic polymer.

The hydrophobic polymer of the three-layer polymer film may be polyolefin (e.g. polyethylene, polypropylene, etc.), polyvinylidene chloride, polyvinyl chloride, polyacrylonitrile, fluorine-containing polymer, liquid crystalline polyester or silicone resin. A stretched highly oriented-high crystalline film has high barrier performance. With respect to polyethylene and polypropylene, a biaxially stretched high-barrier film is used. As the copolymer, a block copolymer is more suitable for the present invention than a graft and an alternative material in because of high barrier property.

The hydrogen-bonding polymer of the two-layer or the three-layer polymer film is at least one selected from nylon 11, nylon 12, polyvinyl alcohol, polymethacrylic acid, polymaleic acid, and a block copolymer containing at least one of them as a polymerization component, and has an operation that it shows high-barrier properties to a molecule having no hydrogen bond because of its strong intermolecular force due to a hydrogen bond. Among them, an ethylene-vinyl alcohol block copolymer (EVOH) is an excellent barrier material.

The hydrogen-bonding polymer layer comprises the amino group, amide group, hydroxyl group or carboxyl group, all of which contain active hydrogen. Thus the hydrogen-bonding polymer layer shows moisture absorption property and also serves as an excellent barrier material of various gasses which does not have active hydrogen because of a strong intermolecular force due to a hydrogen bond. It also has excellent adhesive property against the adhesive hydrophobic polymer layer.

The gas as a subject of barrier are oxygen and polar gas (e.g. NOx, SOx, $NH_3$, etc.), in addition to water (moisture). An excellent barrier layer can be constructed by such a hydrophobic/hydrogen-bonding layer construction and permeation of moisture and oxygen can be sufficiently prevented.

Alternatively, the transparent substrate may be made of a multi-layer film obtained by laminating the two-layer film, or a multi-layer film, having the three-layer polymer film as a basic construction, which is constructed by inserting the adhesive polymer layer between the hydrogen-bonding polymer layer and the hydrophobic polymer layer on every other layer. In case of this multi-layer film, the barrier properties against various substances containing moisture are further enhanced.

For example, the multi-layer film can be constructed by laminating a plurality of co-extruded film of polyvinylidene chloride (PVDC)/ethylene-vinyl alcohol copolymer (EVOH). The ethylene-vinyl alcohol copolymer (EVOH) is a saponified ethylene-vinyl acetate copolymer, and is mainly composed of a block copolymer.

In case that the surface of the hydrogen-bonding polymer layer of the above two- or three-layer polymer film is laminated on the cathode surface of of the panel unit and the hydrogen-bonding polymer layer is completely dried, water in the panel can also removed by the sufficiently dried hydrogen-bonding polymer.

A metal layer or a ceramic thin film may be inserted between any polmer layers of the above polymer film. By using the metal layer or a ceramic thin film which are inorganic materials, the content of water in the device can be further reduced. Examples of the metal layer to be used include thin film and foil of various metals, but Al foil and Al deposit film are most simple and effective. As the ceramic thin film, various ceramic materials can be used and a $SiO_2$ deposit film is one of them suited for the ceramic thin film.

The barrier sheet of the device is preferably also made of the polymer film of the same kind as that of the transparent substrate. As a result, the thickness of the whole device is reduced, thereby making it possible to impart flexibility to the device.

EMBODIMENT 3

The third embodiment of the present invention is a multi-color electroluminescent display panel comprising at least two monochromatic panel units, wherein each monochromatic panel unit comprises
(A) a transparent substrate comprising:
  (a) a two-layer polymer film comprising an adhesive hydrophobic polymer layer containing at least one functional group selected from the group consisting of amino group, amide group, hydroxyl group and carboxyl group in the concentration of not more than 1% by weight and a hydrogen-bonding polymer layer containing at least one functional group selected from the group consisting of amino group, amide group, hydroxyl group and carboxyl group, or
  (b) a three-layer polymer film comprising said hydrogen-bonding polymer layer, a hydrophobic polymer layer made of at least one kind selected from the group consisting of polyolefin, polyvinylidene chloride, polyvinyl chloride, polyacrylonitrile, fluorine-containing polymer, liquid crystalline polyester and silicone resin and an adhesive polymer layer inserted therebetween containing at least one functional group selected from the group consisting of amino group, amide group, hydroxyl group and carboxyl group;
(B) a striped transparent anode on the transparent substrate;
(C) a fluorescent organic layer having an electron transporting organic molecule and a hole transporting organic molecule; and
(D) striped thin film cathodes formed in the direction perpendicular to the striped transparent anode with half or less width of a full width of a picture element of the multi-color electroluminescent device, and wherein the monochromatic panel units are laminated each other so that said striped thin film cathodes are not overlapped each other above and below.

In this embodiment, a transparent substrate of the following panel unit, made of one polymer film is directly laminated on the striped thin film cathode of one monochromatic panel unit. The one polymer film plays both of a role of a transparent substrate of the monochromatic panel unit of the former and a role of a barrier sheet of the monochromatic panel unit of the latter are made to serve a double purpose.

By using a hydrophobic and hydrogen-bonding laminated polymer film as the transparent substrate, there can be obtained a long life display which markedly reduced the water inhibits the water content and causes no change in luminance with a lapse of time and has few dark spots. Since the substrate is thin, the total thickness is small even if monochromatic panel units are laminated.

Since the transparent substrate and barrier sheet are made of one polymer film, to serve a double purpose and the thickness can be reduced while maintaining the barrier property, the distance in back and forth between adjacent picture elements can be reduced. Therefore, even if the picture plane is diagonally observed, there is not caused a disadvantage that emitted light is reduced by reflecting on adjacent striped thin film cathodes of the upper light emitting unit. Therefore, the efficiency and color separation are excellent.

The thickness of the film of the substrate in the present invention is preferably half or less of the width of picture element. The smaller the thickness of the film, the more emitted light can be taken out without causing reflection loss and absorption loss, and the lesser turbulance of the image is caused. Since the size of the picture element of each monochromatic panel unit is not more than 100 $\mu$m in width, the thickness of the film is preferably not more than 50 $\mu$m. The thickness of the light emitting device itself is not more than 1 $\mu$m and is considerably smaller than that of the film.

The barrier sheet to be formed on the outside of the thin film cathode of each monochromatic light emitting panel may be independently provided without serving as the transparent substrate of the other monochromatic light emitting panel. Consequently, it becomes possible to independently to handle each monochromatic panel unit and efficiently to eliminate defective panels by inspection in the production process. The barrier sheet may be any transparent material, but is preferably formed by using the polymer sheet of the present invention like the transparent substrate. Since the polymer sheet of the present invention has high barrier properties and its thickness can be reduced, the distance in back and forth between adjacent picture elements is reduced.

With respect to the lamination construction in this embodiment, since the striped thin film cathodes corresponding to three primary color are constructed and striped transparent anodes are constructed in the direction perpendicular to them, striped transparent anodes of the respective substrates may be overlapped each other above and below. Thus, it is possible to spread the width of the striped transparent anode of high resistivity. It is useful in case of large picture plane.

The display panel having the construction, wherein the striped thin film cathode is formed on the opposite side of the striped transparent anode on the transparent substrate and then laminated to form the same structure, is also included in variation of the present invention.

Each striped transparent anode in the same picture segment of the each monochromatic panel unit may be connected each other to form a common terminal. The multilayer panel also has an advantage that the connection of many lead wires is not complicated.

With the construction wherein the end of the above laminated panel is sealed by hot-melt adhesion, sealing can be simply performed efficiently by making use of the hot-melt adhesive property of the polymer layer. When the film of the panel unit itself has hot-melt adhesive properties, heat sealing can be performed without using an adhesive. Examples of the hot-melt adhesives are adhesive polyethylene, heat-sealing polyester (PET), polyamide (PA), EVOH and polyvinylidene chloride.

As the adhesive may be used in this sealing, there can be preferably used an epoxy resin, an acrylic resin and a silicone resin, which hardly evolve a gas.

The embodiments of the present invention will be described with reference to FIG. 1 to FIG. 6.

Figure 1B:
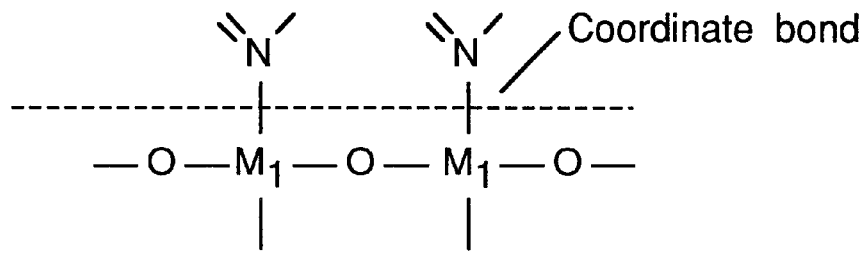

FIG. 1 is a schematic diagram showing one example of a molecular structure at the hydrophobic surface of the transparent anode or the transparent substrate of the electroluminescent device in embodiment 1 according to the present. FIG. 1A shows a structure wherein a metal element (M1) on the surface of the substrate or electrode is bonded to a metal element (M2) in a modifying molecule through oxygen on the surface. Since the metal element (M1) on the surface is mainly composed of Si, Sn and In, the metal element (M2) in the modifying molecule is mainly composed of Si, Sn and In, preferably. FIG. 1B shows a chelete structure wherein a metal element (M1) on the surface of the substrate or electrode is coordinately bonded directly to a nitrogen element (N) in a modifying molecule, which has an excellent effect of enhancing the stability of the surface.

Figure 2:
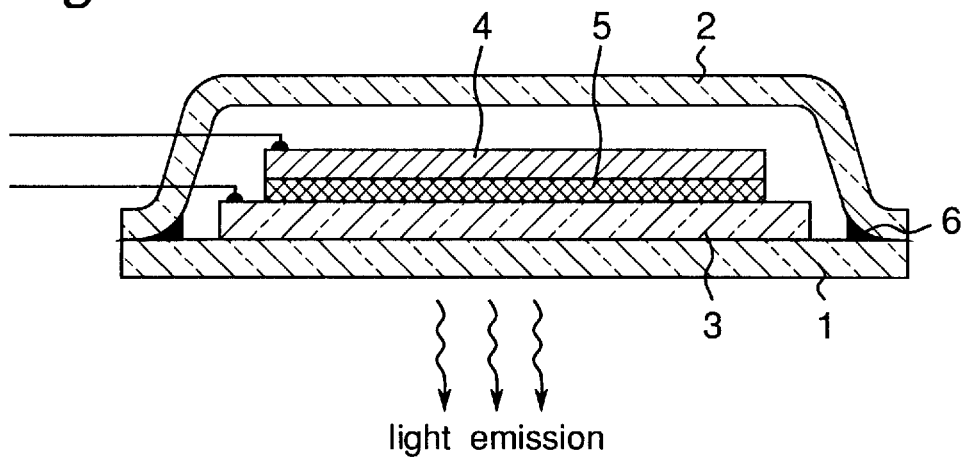
FIG. 2 is a schematic diagram showing one example of a construction of the electroluminescent device according to the present invention.

FIG. 2 is a schematic diagram showing one example of a construction of the electroluminescent device according to the present invention. In a sealed vessel consisting of a transparent substrate 1 and a barrier sheet 2, an organic light emitting layer 5 consisting of an electron transporting organic molecule and a hole transporting organic molecule is formed between a transparent anode 3 formed on the transparent substrate 1 and a thin film cathode 4 containing an alkali metal or alkali earth metal. 6 is a hot melt adhesive layer for sealing. This hot melt adhesive is not needed necessarily in case that a multi-layer polymer film itself has a hot melt adhesive capability.

Figure 3A:
FIG. 3 is a schematic diagram showing a construction of the laminated polymer film in the embodiment 2 according to the present invention.

FIG. 3 is a schematic diagram showing a construction of the laminated polymer film of the embodiment 2 according to the present invention, and FIG. 3A shows a case of two-layer construction, in which 7 denotes an adhesive hydrophobic polymer layer containing at least one functional group selected from the group consisting of amino group, amide group, hydroxyl group and carboxyl group in the concentration of not more than 1% by weight, and 8 denotes a hydrogen-bonding polymer layer containing at least one functional group selected from the group consisting of amino group, amide group, hydroxyl group and carboxyl group. By laminating these layers, a film having high barrier property can be constructed. A film having a multi-layer structure obtained by further laminating these two layers exhibits higher barrier effect.

Figure 3B:
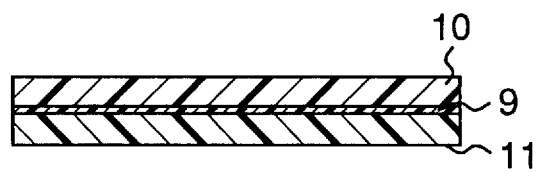
Figure 3C:
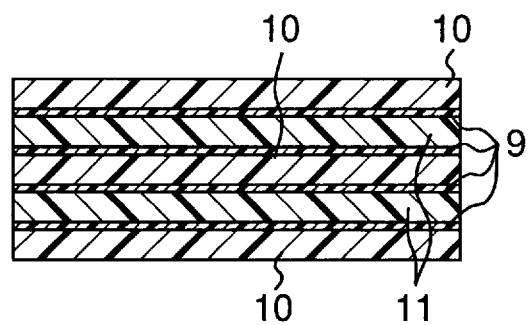

FIG. 3B shows a case of three-layer construction and is composed of a three-layer film obtained by interposing an intermediate polymer layer of an adhesive polymer layer 9 containing at least one functional group selected from the group consisting of amino group, amide group, hydroxyl group and carboxyl group between a hydrogen-bonding polymer layer 11 having at least one functional group selected from the group consisting of amino group, amide group, hydroxyl group and carboxyl group and a hydrophobic polymer layer 10 made of at least one kind selected from the group consisting of polyolefin (OPP: stretched PP having high crystalinity), polyvinylidene chloride, polyvinyl chloride, polyacrylonitrile, fluorine-containing polymer, liquid crystalline polyester and silicone resin. By laminating these layers, a film having high barrier property can be constructed similar to the case of the above two-layer system. A multi-layer structure film having this three-layer film as a basic construction is constructed by inserting the above intermediate layer 9 between the hydrogen-bonding polymer layer 11 and hydrophobic polymer layer 10 on every other layer (FIG. 3C).

Figure 4:
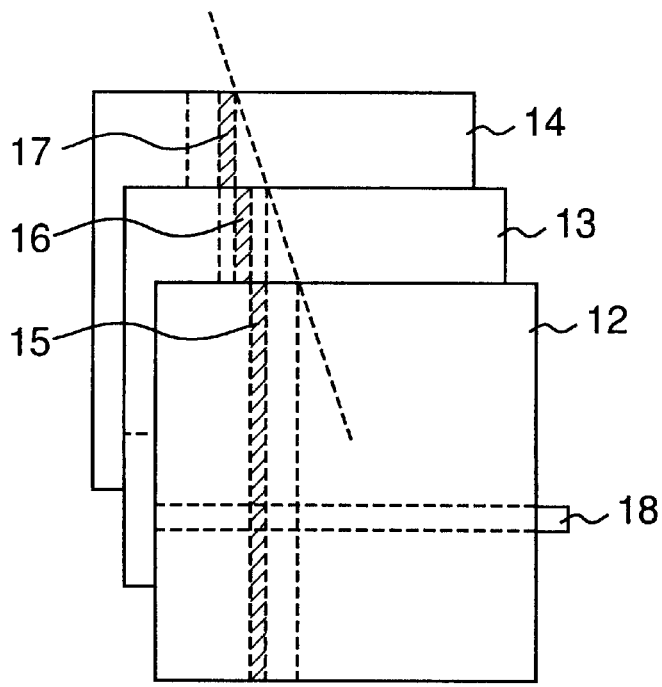
FIG. 4 is a schematic diagram showing one example of a laminated structure of the color electroluminescent display panel in the embodiment 3 according to the present invention.

FIG. 4 is a schematic diagram showing one example of a laminated structure of the color electroluminescent display panel of the embodiment 3 according to the present invention, and a color display panel is constructed by laminating three monochromatic light emitting panel units 12 (red), 13 (green) and 14 (blue) so that the above striped thin film cathodes 15, 16 and 17 are not overlapped each other above and below, as shown in the drawing. The width of the above striped thin film cathodes 15, 16 and 17 is adjusted to one third of the full-color light emitting width of the picture element. 18 denotes a perpendicularly intersecting striped transparent anode.

Figure 5:
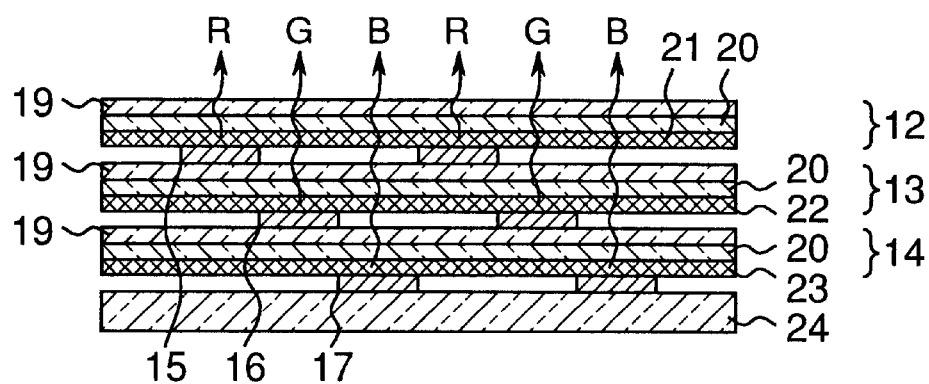
FIG. 5 is a schematic diagram showing a cross-sectional structure of one example of the laminated color electroluminescent display panel in the embodiment 3 according to the present invention.

FIG. 5 is a schematic diagram showing a cross-sectional structure of the laminated color electroluminescent display panel according to the present invention. As shown in the drawing, three monochromatic light emitting panel units 12 (red), 13 (green) and 14 (blue) are laminated and light of red, green and blue are emitted from the respective layers and displayed. The striped thin film cathodes 15, 16 and 17 are laminated in the width of one third as large as that of the full-color light emitting width of the picture element so that they are not overlapped each other above and below. In the respective monochromatic light emitting panel units, a striped transparent anode 20 is formed on a transparent substrate 19 of the polymer film having a hydrophobic surface, and striped thin film cathodes 15, 16 and 17 are formed thereon in the direction perpendicular to the above striped transparent anode through a monochromatic fluorescent organic layer 21, 22 and 23 having an electron transporting organic molecule and a hole transporting organic molecule. 24 denotes a back face barrier sheet and is preferably made of the same laminated polymer film as that of the present invention used in the above transparent substrate.

Figure 6:
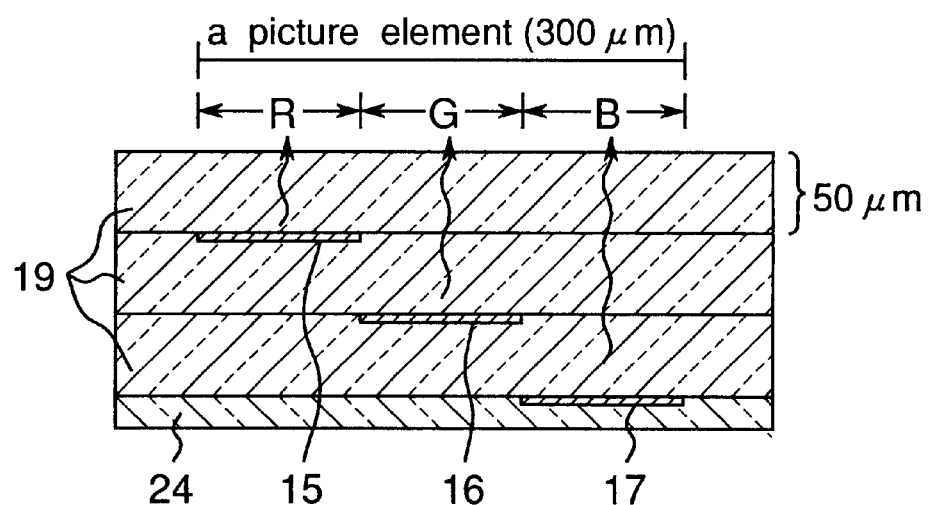
FIG. 6 is a cross-sectional diagram showing a proportion of a thickness to a picture element width of each layer of a cross section of the laminated color electroluminescent display panel in the embodiment 3 according to the present invention.

FIG. 6 is one example of a cross-sectional diagram showing a proportion of a thickness to a picture element width of each layer of a cross section of the laminated color electroluminescent display panel according to the present invention. For example, when a set of picture element is 300 $\mu$m in size and the thickness of the transparent substrates 19 of the polymer film is 50 $\mu$m, the total thickness of thin film cathode 15–17, the organic light emitting layer (not indicated in the figure) and the transparent anode (not indicated in the figure) is not more than 1 $\mu$m, which thickness is very smaller than that of the transparent substrate as shown in FIG. 6.

As is apparent from the drawing, the thickness of the substrate is preferably half as large as the size of the monochromatic picture element. The smaller the thickness of the film, the lesser the reflection loss and absorption loss of light emission, and the lesser turbulance of the image.

The Examples of the present invention will be described below.

EXAMPLE 1

A glass substrate, on which a transparent anode of an indium tin oxide (ITO) thin film is formed, was immersed in a mixed solution of potassium hydroxide and water for 30 seconds. After the surface of the ITO thin film and the surface of the glass substrate were slightly hydrophilized, the glass substrate was washed with water and then sufficiently dried at 100° C. This glass substrate was immersed in a solution of phenyldiethylsilyl chloride to impart hydrophobicity to the surface, as shown in FIG. 1(a), and then sufficiently washed. This substrate was dried at 150° C. for 1 hour and then set in a vacuum depositing apparatus as a deposition target.

N,N'-bis(2-methylphenyl)-N,N'-diphenyl-(1,1-biphenyl)-4,4'-diamine (TPD) as the hole transporting organic molecule, Alq as the electron transporting organic molecule, an aluminium metal and a lithium metal were respectively charged in four heating boats as an evaporation source, and then set. The boat of lithium metal was covered with a wire gauze of 400 mesh. After a bell jar was closed and the bell jar was evacuated until the vacuum degree became $2\times10^{-6}$ Torr, TPD was deposited in a film thickness of 80 nm on the above glass substrate by electric resistance heating of the boat of TPD at a deposition rate of about 0.1 nm per second. Then, Alq was deposited in a film thickness of 50 nm by electric resistance heating of the boat of Alq at the same deposition rate of about 0.1 nm per second. While monitoring deposition rate of lithium as the thin film cathode using a film thickness sensor, Al was evaporated from the boat and the evaporation rates of them was fixed to 1.5 nm per second. Then, a 2% (by weight) lithium-containing alloy thin film was deposited in a film thickness of 160 nm by simultaneously depositing them.

To the plate-shaped electroluminescent device thus obtained, DC voltage was applied and light emitting characteristics thereof were determined. As a result, a current of 2.5 mA/cm$^2$ flowed by applying 5 V and luminance of 105 cd/m$^2$ with high uniformity was obtained. The life test was performed at 100 cd/m$^2$. As a result, the half life of luminance was prolonged by eight times as comparative Example 1 below. The number of dark spots was small (1/8) compared with Comparative Example 1 at an initial stage.

EXAMPLE 2

An aluminosilicate glass substrate, on which a transparent anode of an ITO thin film is formed, was immersed in a weak alkali washing water containing a cationic surfactant. Only the ITO surface was hydrophilized and the surface of the hydrophobic glass substrate was washed as it is. Then, the glass substrate was washed with water and then sufficiently dried at 100° C. This glass substrate was immersed in a solution of phenyldiethylsilyl chloride to impart hydrophobicity to the ITO surface, and then sufficiently washed, as shown in FIG. 1A. This substrate was dried at 120° C. for 3 hours and then set in a vacuum depositing apparatus as a deposition target. According to the same manner as that described in Example 1, various materials were deposited on the substrate to obtain an electroluminescent device.

To the plate-shaped electroluminescent device thus obtained, DC voltage was applied and light emitting characteristics thereof were determined. As a result, a current of 2.4 mA/cm$^2$ flowed by applying 5 V and luminance of 101 cd/m$^2$ with high uniformity was obtained. The life test was performed at 100 cd/m$^2$. As a result, the half life of luminance was prolonged by six times as Comparative Example 1 below. The number of dark spots was small (1/12) compared with Comparative Example 1 at an initial stage.

EXAMPLE 3

A transparent thin film of zinc oxide was grown on the surface of a glass substrate. Then, an ITO thin film was formed in the striped form, as a transparent anode. This substrate was thermally oxidized at 400° C. for 1 hour, and then set in a vacuum depositing apparatus as a deposition target. According to the same manner as that described in Example 1, various materials were deposited on the substrate to obtain an EL device.

The ITO surface oxidized thermally at high temperature was hydrophobic because active hydrogen on the surface is eliminated.

To the plate-shaped electroluminescent device thus obtained, DC voltage was applied and light emitting characteristics thereof were determined. As a result, a current of 2.1 mA/cm$^2$ flowed by applying 5 V and luminance of 115 cd/m$^2$ with high uniformity was obtained. The life test was performed at 100 cd/m$^2$. As a result, the half life of luminance was prolonged by ten times as Comparative Example 1 below. The number of dark spots was small (1/20) compared with Comparative Example 1 at an initial stage. That is, an excellent device was obtained. EXAMPLE 4

A substrate of an aluminosilicate glass of 10 cm square, on which a transparent anode composed of an ITO thin film was formed, was sufficiently washed by using an acetone reflux type washing device, thermally oxidized at 350° C. for 3 hours, and then set in a vacuum depositing apparatus as a deposition target. According to the same manner as that described in Example 1, a device was made.

To the plate-shaped electroluminescent device thus obtained, DC voltage was applied and light emitting characteristics thereof were determined. As a result, a current of 1.9 mA/cm$^2$ flowed by applying 5 V and luminance of 121 cd/m$^2$ with high uniformity was obtained. The life test was performed at 100 cd/m$^2$. As a result, the half life of luminance was prolonged by six times as Comparative Example 1 below. The number of dark spots was small (1/16) compared with Comparative Example 1 at an initial stage.

EXAMPLE 5

A glass substrate on which a transparent anode is formed, which was hydrophilized according to the same manner as that described in Example 1, was immersed in a solution of phenoxydimethyl indium chloride to impart hydrophobicity to the surfaces, as shown in FIG. 1, and then sufficiently washed. The resulting substrate, wherein hydrophobicity was imparted to the surface by using phenoxydimethyl indium, was dried at 130° C. for 1 hour and then set in a vacum depositing apparatus as a deposition target, together with four heating boats as an evaporation source. TPD as the hole transporting organic molecule, Alq as the electron transporting organic molecule, an aluminium metal and a lithium metal were respectively charged in the respective heating boats, and then set. The boat of lithium metal was covered with a wire gauze of 400 mesh. After a bell jar was closed and the bell jar was evacuated until the vacuum degree became $2\times10^{-6}$ Torr, these materials were deposited under the same conditions as those in case of Example 1 to make an EL device.

To the plate-shaped electroluminescent device thus obtained, DC voltage was applied and light emitting characteristics thereof were determined. As a result, a current of 1.8 mA/cm$^2$ flowed by applying 5 V and luminance of 108 cd/m$^2$ with high uniformity was obtained. The life test was performed at 100 cd/m$^2$. As a result, the half life of luminance was prolonged by seven times as Comparative Example 1 below. The number of dark spots was small (⅕) compared with Comparative Example 1 at an initial stage. That is, an excellent device was obtained.

EXAMPLE 6

A glass substrate on which a transparent anode is formed, which was imparted hydrophobicity according to the same manner as that described in Example 1, was set in a vacuum depositing apparatus as a deposition target, together with five heating boats as an evaporation source. TPD as the hole transporting organic molecule, Alq as the electron transporting organic molecule, a triazole derivative (5,7-dimethyl-s-triazopyrimidine), an aluminium metal and a lithium metal were respectively charged in the respective heating boats, and then set. The boat of lithium metal was covered with a wire gauze of 400 mesh. After a bell jar was closed and the bell jar was evacuated until the vacuum degree became 2×10$^{-6}$ Torr, TPD was deposited in a film thickness of 85 nm on the above glass substrate by electric resistance heating of the boat of TPD at a deposition rate of about 0.1 nm per second. Then, Alq was deposited in a film thickness of 45 nm by electric resistance heating of the boat of Alq at the same deposition rate of about 0.1 nm per second.

Then, the boats respectively containing lithium metal, aluminum metal and triazole derivative as a evaporation source were heated to form a hydrophobic thin film of a double metal-core triazole complex of Al and Li having a thickness of about 5 nm. At this time, the boat of lithium metal was heated before formation of the thin film, and then an impurity gas was removed at a temperature close to a melting point for a long time and the evaporation rate was precisely controlled while monitoring using another film thickness sensor for lithium so that the evaporation rate becomes about 0.02 nm.

Subsequently, the boats of lithium metal and aluminum metal were heated and the evaporation rate of them was fixed to 1.5 nm per second. Then, a 1.6% (by weight) lithium-containing metal alloy was deposited in the thickness of 195 nm by simultaneously depositing them to form a thin film cathode.

To the plate-shaped electroluminescent device thus obtained, DC voltage was applied and light emitting characteristics thereof were determined. As a result, a current of 2.2 mA/cm$^2$ flowed by applying 5 V and luminance of 118 cd/m$^2$ with high uniformity was obtained. The life test was performed at 100 cd/m$^2$. As a result, the half life of luminance was prolonged by fourteen times as Comparative Example 1 below. The number of dark spots was small (1/18) compared with Comparative Example 1 at an initial stage. That is, an excellent device was obtained.

EXAMPLE 7

A multi-layer film constructed by laminating three sheets of two-layer films (maleic acid-modified polyethylene layer of 16 μm in thickness and nylon 12 layer of 16 μm in thickness) was prepared and sufficiently dried. Then, a striped transparent anode formed on maleic acid(0.1 wt %)-modified ethylene, and cut into pieces of 10 cm square, which were taken as a transparent substrate. Each of three transparent substrates was set in a vacuum depositing apparatus as a depositiou target.

On each transparent substrate on which striped transparent anodes were formed, an organic layer capable of emitting fluorescent light of red (R), green (G) or blue (B) was respectively formed. Then, a monochromatic light emitting panel unit was constructed by forming a striped thin film cathode composed of an Al—Li electrode in the width of one third as large as that of the RGB full-color light emitting width of the picture element in the direction perpendicular to the above striped transparent anode. Three monochromatic light emitting panel units (R, G, B) thus constructed were laminated so that the striped thin film cathodes are not overlapped each other above and below, as shown in FIG. 4. A sheet obtained by laminating an 20 μm Al layer on the above multi-layer film was prepared as a barrier sheet and the barrier sheet was covered on the exposed thin film cathode of the laminated panel units so that the dry nylon 12 layer of the barrier sheet faces inside. Then the whole panel was bonded at the peripheral edge by utilizing hot-melt adhesive property of each substrate. Furthermore, the peripheral portion was double sealed with an epoxy resin. The three ITO electrodes of the above three monochromatic light emitting panel units were connected each other and were taken out as a common electrode.

To the plate-shaped electroluminescent display panel thus obtained, DC voltage was applied and light emitting characteristics thereof were determined. As a result, a current of 2–5 mA/cm$^2$ flowed by applying 5 V and an uniform color image having luminance of 80 cd/m$^2$ was obtained. Even in the life test under high humidity environment, an influence of humidity was hardly exerted.

EXAMPLE 8

In place of the multi-layer film used in Example 7, multi-layer films of the following two kinds of three-layer constructions were prepared.
(a) multi-layer film composed basically of three layers (biaxially stretched crystalline polypropylene having a thickness of 15 μm and nylon 12 having a thickness of 15 μm were altenatively laminated three times inserting EVOH having a thickness of 10 μm between them on every other layer)
(b) multi-layer film composed basically of three kind of layers (high-density polypropylene having a thickness of 15 μm and transparent nylon 12 having a thickness of 10 μm were alternatively laminated three times inserting an ethylene-vinyl butyral copolymer film having a thickness of 10 μm between them on every other layer).

On the biaxially stretched crystalline polypropylene of (a) and the surface of the high-density polyethylene of (b), a transparent anode composed of an ITO thin film was respectively formed, followed by cutting. Three substrates were respectively prepared for (a) and (b). According to the same manner as that described in Example 1, each device of each color was formed to make three monochromatic light emitting panel units (R, G, B) were respectively made. These three monochromatic light emitting panel units (R, G, B) were laminated so that the above striped thin film cathodes are not overlapped each other above and below. Then, on the thin film cathode facing outside, the multi-layer film (a) and multi-layer film (b) having the same kind as that of the substrate are respectively laminated and the peripheral edges were thermally bonded to obtain a plate-shaped color electroluminescent display panel.

To these color electroluminescent display panels (a), (b) thus obtained, DC voltage was applied to emit light. As a result, a current of 4–10 mA/cm$^2$ flowed by applying 8 V and an uniform color image having luminance of about 250 cd/m² was obtained. Even in the life test under high humidity environment, an influence of humidity was hardly exerted.

EXAMPLE 9

In place of the multi-layer film used in Example 7, the following three kinds of two-layer films were used as a barrier sheet and a substrate film.
(a) two-layer film (maleic acid-modified polyethylene having a thickness of 35 μm+nylon 12 having a thickness of 35 μm)
(b) two-layer film (methacrylic acid-modified polyethylene having a thickness of 35 μm+ethylene-vinyl alcohol copolymer (EVOH) having a thickness of 35 μm)
(c) two-layer film (maleic acid-modified polypropylene having a thickness of 30 μm+nylon 11 having a thickness of 35 μm)

The life of the green EL device covered with each of these barrier sheets was 3, 6 or 3.5 times as long as that of Comparative Example 2 in case of (a), (b) or (c).

EXAMPLE 10

In place of the multi-layer film used in Example 7, the following three kinds of three-layer films were used as a barrier sheet and a substrate film.
(a) three-layer film (ethylene-tetrafluoroethylene alternative copolymer having a thickness of 30 μm+ethylene-vinyl butyral copolymer having a thickness of 8 μm+nylon 12 having a thickness of 35 μm)
(b) three-layer film (polyvinylidene chloride having a thickness of 30 μm+urethane-modified vinyl chloride having a thickness of 10 μm+EVOH having a thickness of 40 μm)
(c) three-layer film (crystalline polypropylene having a thickness of 30 μm+adhesive polyamide having a thickness of 6 μm+nylon 12 having a thickness of 35 μm)

The life of the green EL device covered with each of these barrier sheets was 8.5, 4 or 6 times as long as that of Comparative Example 2 in case of (a), (b) or (c).

COMPARATIVE EXAMPLE 1

A soda-lime glass substrate, on which a transparent anode of an ITO thin film was formed, was heat-treated at 350° C. for 1 hour, cooled and then set in a vacuum depositing apparatus as a deposition target. TPD as the hole transporting organic molecules Alq as the electron transporting organic molecule, an aluminium metal and a lithium metal were respectively charged in the respective four heating boats as an evaporation source, and then set. After a bell jar was closed and the bell jar was evacuated until the vacuum degree became $3\times10^{-6}$ Torr, these materials were deposited according to the same manner as that described in Example 1 to obtain an electroluminescent device.

Then, the device was interposed between glass plates and the peripheral portion was sealed with an epoxy adhesive.

To the resulting device, DC voltage was applied and light emitting characteristics thereof were determined. As a result, a current of 3–4 mA/cm² flowed by applying 12 V and luminance of 100–125 cd/m² with non-uniformity was obtained. The life test was performed at 100 cd/m². It was very dark light emission at 7 V. The initial number of dark spots was large such as 12 points/mm² in average. As a result of the life test at 100 cd/m², the half life of luminance was 280 hours.

COMPARATIVE EXAMPLE 2

A silicon dioxide coated-glass substrate, on which a transparent anode of an ITO thin film was formed, was heat-treated at 350° C. for 1 hour, cooled and then set in a vacum depositing apparatus as a deposition target. TPD as the hole transporting organic molecule, Alq as the electron transporting organic molecule, an aluminium metal and a lithium metal were respectively charged in the respective four heating boats as an evaporation source, and then set. After a bell jar was closed and the bell jar was evacuated until the vacuum degree became $3\times10^{-6}$ Torr, these materials were deposited according to the same manner as that described in Example 1 to obtain an electroluminescent device.

Then, the device was coated with a polyvinylidene chloride film having a thickness of 50 μm as the barrier sheet 2, as shown in FIG. 2, and the peripheral portion was sealed with an epoxy adhesive.

To the resulting device, DC voltage was applied and light emitting characteristics thereof were determined. As a result, a current of 2.5 mA/cm² flowed by applying 6 V and luminance of 65 cd/m² with high uniformity was obtained. As a result of the life test at 100 cd/m², the half life of luminance was 280 hours. The grow rate of the dark spot diameter was about 0.3 μm per hour during initial three days.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. An electroluminescent device comprising a transparent substrate; a transparent anode formed on said transparent substrate; a thin film cathode containing an alkali metal or an alkali earth metal; an electron transporting organic molecule and a hole transporting organic molecule between a pair of electrodes consisting of said transparent anode and said thin film cathode; and a barrier sheet for covering the outer surface of said thin film cathode; wherein said transparent substrate has a multi-layered structure including a hydrophobic layer placed at an inner surface of said transparent substrate and a hydrogen-bonding layer.

2. An electroluminescent device according to claim 1, wherein said transparent anode has a hydrophobic surface without N—H bond and O—H bond.

3. An electroluminescent device according to claim 2, wherein the molecular structure of the hydrophobic surface of the transparent anode is an aromatic molecular structure which has not any of an O—H bond and a N—H bond.

4. An electroluminescent device according to claim 3, wherein the transparent anode is made of a transparent conductive film containing indium oxide or tin oxide as a main component and the surface structure with said aromatic molecular structure comprises one group selected from the group consisting of phenoxysilyl group, phenylsilyl group, phenoxytin group, phenyltin group, phenoxyindium group and phenylindium group.

5. An electroluminescent device according to wherein said aromatic molecular structure comprises one kind selected from the group consisting of tertiary, aromatic amine, aromatic ether, nitrogen coordination metal complex and oxygen coordination metal complex.

6. An electroluminescent device according to claim 5, wherein said nitrogen coordination metal complex is an organometal complex containing, as a ligand, at least one nitrogen-containing aromatic compound selected from the group consisting of quinoline compound, imidazole compound, triazole compound, oxadiazole compound, oxyquinazoline compound and triphenylamine compound.

7. An electroluminescent device according to claim 2, wherein the molecular structure of the hydrophobic surface of the transparent substrate has a silicate salt of at least one metal element selected from zinc, cadmium, tin, lead and indium.

8. An electroluminescent device according to claim 2, wherein the transparent substrate is a glass substrate made of aluminosilicate glass.

9. An electroluminescent device according to claim 2, wherein the transparent substrate is a glass substrate whose surface is provided with a transparent protective layer having a hydrophobic surface with a molecular structure without having active hydrogen.

10. An electroluminescent device according to claim 2, wherein all of the surface of the thin film cathode, the electron transporting organic molecule and the hole transporting organic molecule have a hydrophobic molecular structure without having active hydrogen, which does not contain any of an O—H bond and a N—H bond.

11. An electroluminescent device according to claim 1, wherein said hydrophobic layer is a polymer layer wherein a concentration of any hydrophilic functional group is not more than 1 wt % and said hydrogen-bonding layer is a polymer layer containing at least one functional group selected from the group consisting of amino group, amide group, hydroxyl group and carboxyl group.

12. An electroluminescent device according to claim 11, wherein said transparent substrate comprises:

a two-layer polymer film comprising an adhesive hydrophobic polymer layer containing at least one functional group selected from the group consisting of amino group, amide group, hydroxyl group and carboxyl group in the concentration of not more than 1% by weight and a hydrogen-bonding polymer layer containing at least one functional group selected from the group consisting of amino group, amide group, hydroxyl group and carboxyl group.

13. An electroluminescent device according to claim 11, wherein said transparent substrate comprises:

a three-layer polymer film comprising said hydrogen-bonding polymer layer, a hydrophobic polymer layer made of at least one kind selected from the group consisting of polyolefin, polyvinylidene chloride, polyvinyl chloride, polyacrylonitrile, fluorine-containing polymer, liquid crystalline polyester and silicone resin and an adhesive polymer layer inserted therebetween containing at least one functional group selected from the group consisting of amino group, amide group, hydroxyl group and carboxyl group.

14. An electroluminescent device according to claim 12, wherein the transparent substrate comprises a multi-layer film obtained by laminating said two-layer polymer film.

15. An electroluminescent device according to claim 13, wherein the transparent substrate comprises a multi-layer film having said three-layer polymer film as a basic construction and is constructed by inserting said adhesive polymer layer between said hydrogen-bonding polymer layer and said hydrophobic polymer layer on every other layer.

16. An electroluminescent device according to claim 12 or 13, wherein both of said transparent anode and said thin film cathode have a periodical striped form and said thin film cathode is arranged in the direction perpendicular to said transparent anode and has half or less width of an arrangement period of said thin film cathode;

and wherein said transparent substrate, said transparent anode, said thin film cathode, said electron transporting organic molecule and said hole transporting organic molecule compose a unit cell, said unit cell being repeated at least twice and laminated to each other so that said thin film cathodes do not overlap each other in the perpendicular direction of said thin film cathode.

17. An electroluminescent device according to claim 16, wherein said transparent substrate of one unit cell is directly laminated on said thin film cathode of another unit cell, thus one polymer film plays both of a role of said transparent substrate of said unit cell of the former and a role of said barrier sheet of said unit cell of the latter.

18. An electroluminescent device according to claim 16, wherein each of said transparent anodes of one unit cell is connected to the corresponding transparent anodes of other unit cells.

19. An electroluminescent device according to claim 16, wherein the thickness of said transparent substrate is not more than 50 $\mu$m.

20. An electroluminescent device according to any one of claims 14, 15, 12 or 13, wherein the hydrogen-bonding polymer is at least one kind selected from the group consisting of nylon 11, nylon 12, polyvinyl alcohol, polymethacrylic acid, polymaleic acid, and block copolymer containing at least one of them as a polymerization component.

21. An electroluminescent device according to any one of claims 14, 15, 12 or 13, wherein a metal layer or a ceramic thin film is inserted between any of said polymer layers of the transparent substrate.

* * * * *